United States Patent [19]

Catlin

[11] Patent Number: 5,005,157
[45] Date of Patent: Apr. 2, 1991

[54] APPARATUS FOR SELECTIVELY PROVIDING RAS SIGNALS OR RAS TIMING AND CODED RAS ADDRESS SIGNALS

[75] Inventor: Robert W. Catlin, Santa Clara, Calif.

[73] Assignee: Chips & Technologies, Inc., San Jose, Calif.

[21] Appl. No.: 436,143

[22] Filed: Nov. 13, 1989

[51] Int. Cl.$^5$ ....................... G11C 7/00; G11C 11/408
[52] U.S. Cl. .............................. 365/193; 365/230.02; 365/230.06; 365/230.08; 365/233; 365/189.03; 365/222
[58] Field of Search ...................... 365/230.01, 230.02, 365/230.03, 189.03, 193, 230.08, 230.06, 222, 233, 189.08

[56] References Cited

U.S. PATENT DOCUMENTS

| | | | |
|---|---|---|---|
| 4,564,926 | 1/1986 | Nikaido et al. | 365/230.02 |
| 4,797,850 | 1/1989 | Amitai | 365/193 X |
| 4,809,234 | 2/1989 | Kuwashiro | 365/230.03 |
| 4,881,206 | 11/1989 | Kadono | 365/230.03 X |

Primary Examiner—Alyssa H. Bowler
Attorney, Agent, or Firm—Townsend and Townsend

[57] ABSTRACT

An improved memory controller which can support varying numbers of banks of memory without requiring any more RAS output pins than are necessary for a minimum number of banks of memory. The memory controller chip has N RAS output pins. An internal decoder selects one of N decode outputs after decoding internally provided coded RAS addresses. A timing signal is generated to control the duration of the selected decoder output to provide the proper pulse length for the RAS signal. An internal multiplexer, with its outputs coupled to the RAS output pins, selects either the N decode outputs from the decoder or the timing signal and the internally provided addresses directly.

7 Claims, 5 Drawing Sheets

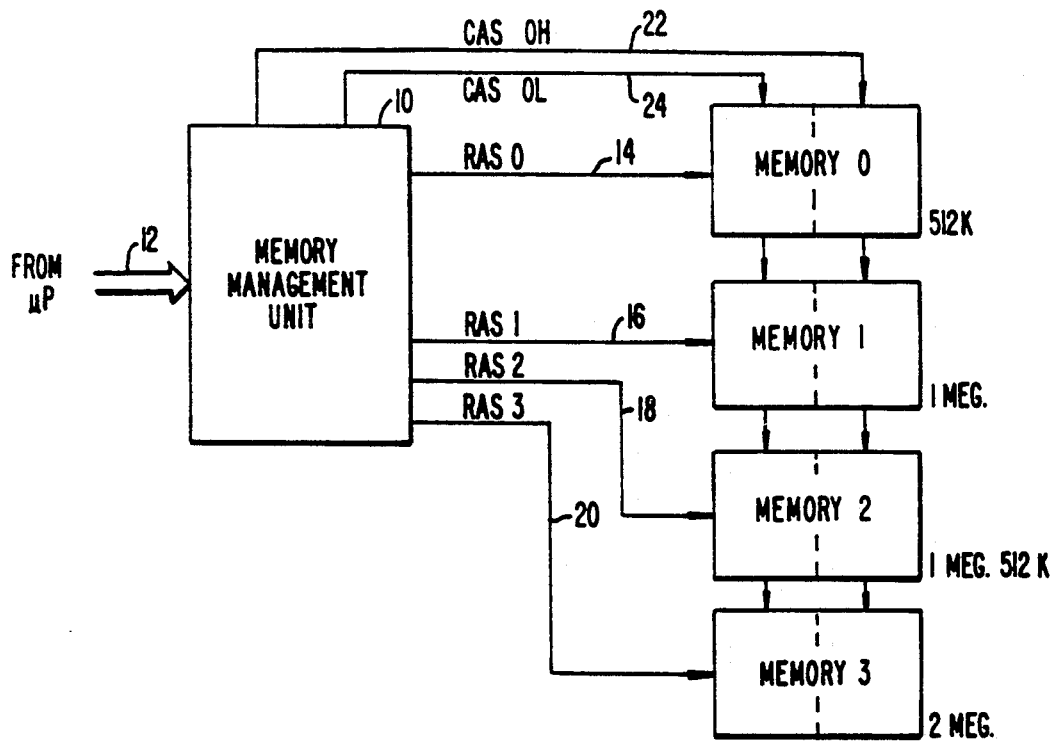
FIG.—1. PRIOR ART
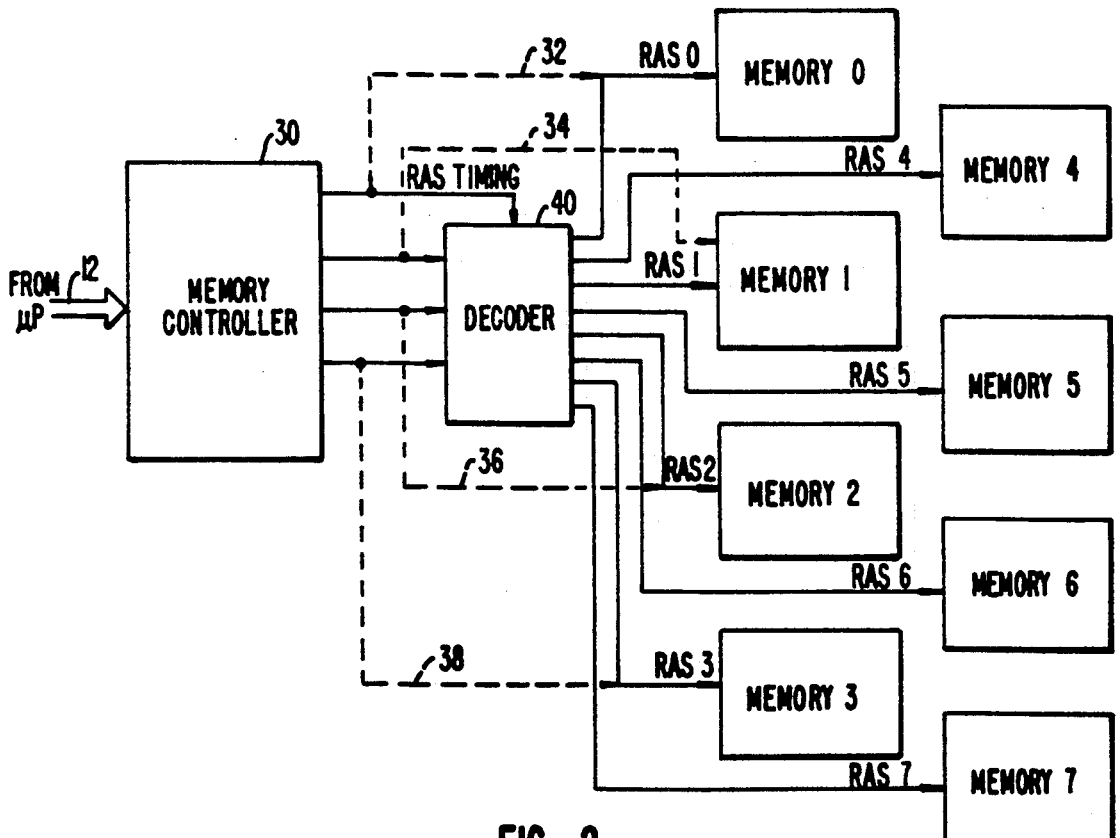
FIG.—2.

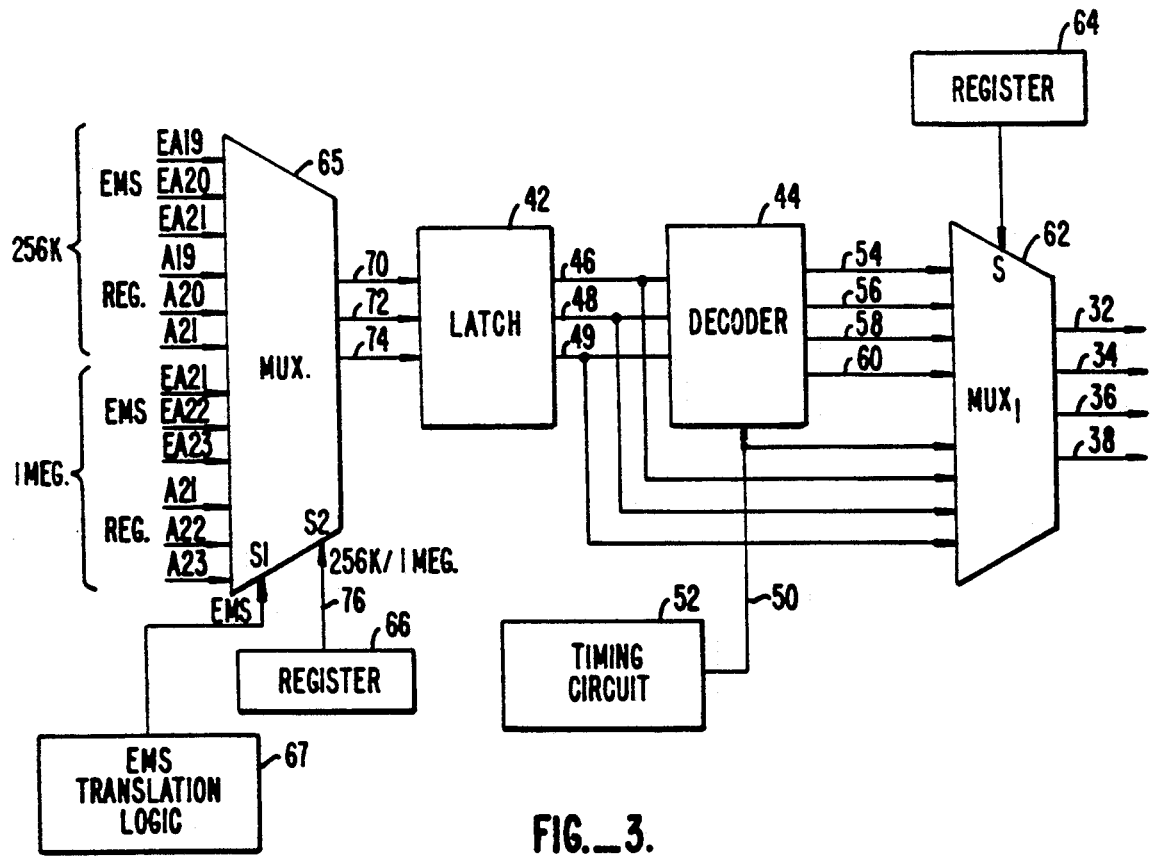
FIG._3.
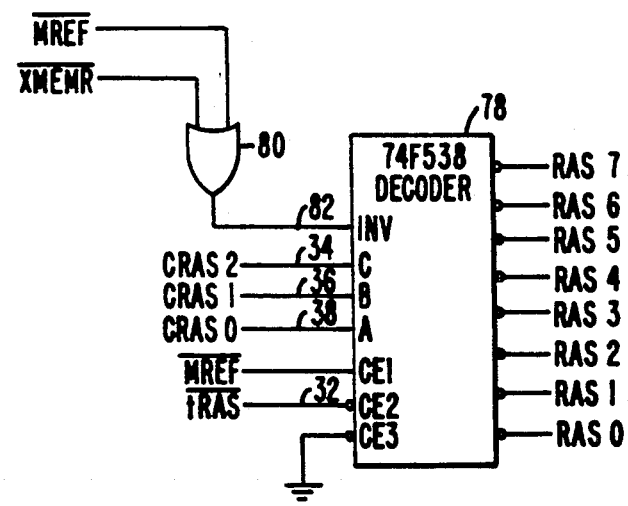
FIG._4.

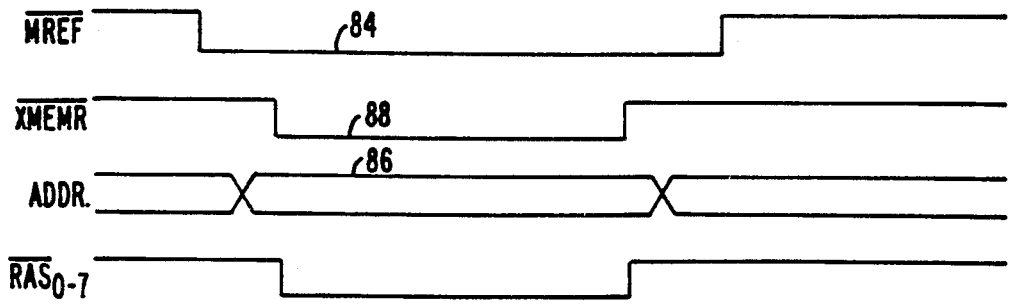
REFRESH TIMING
FIG._5A.
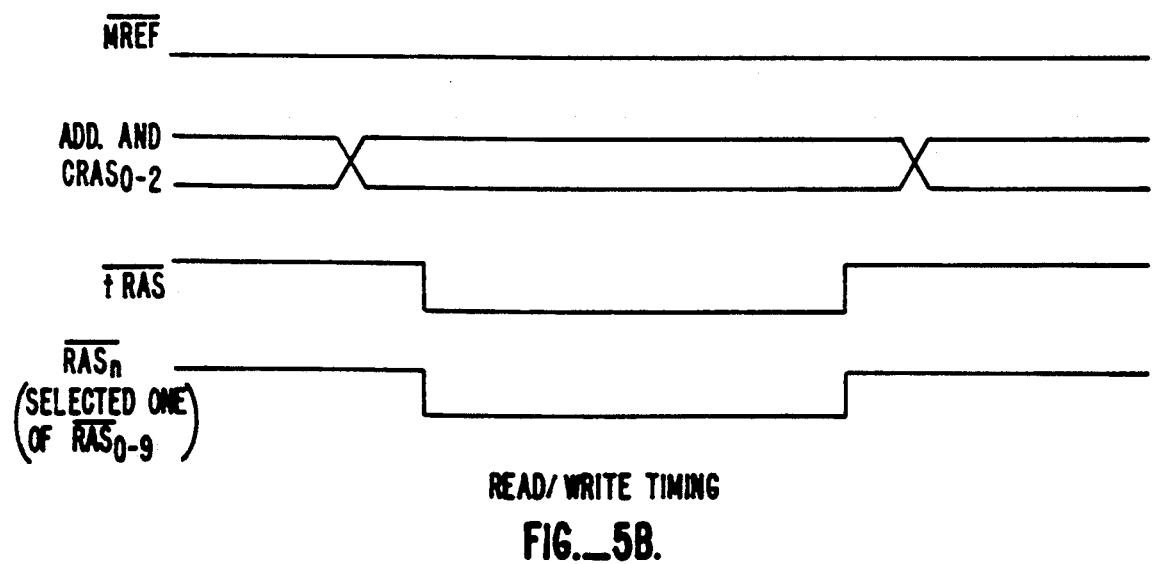
READ/WRITE TIMING
FIG._5B.

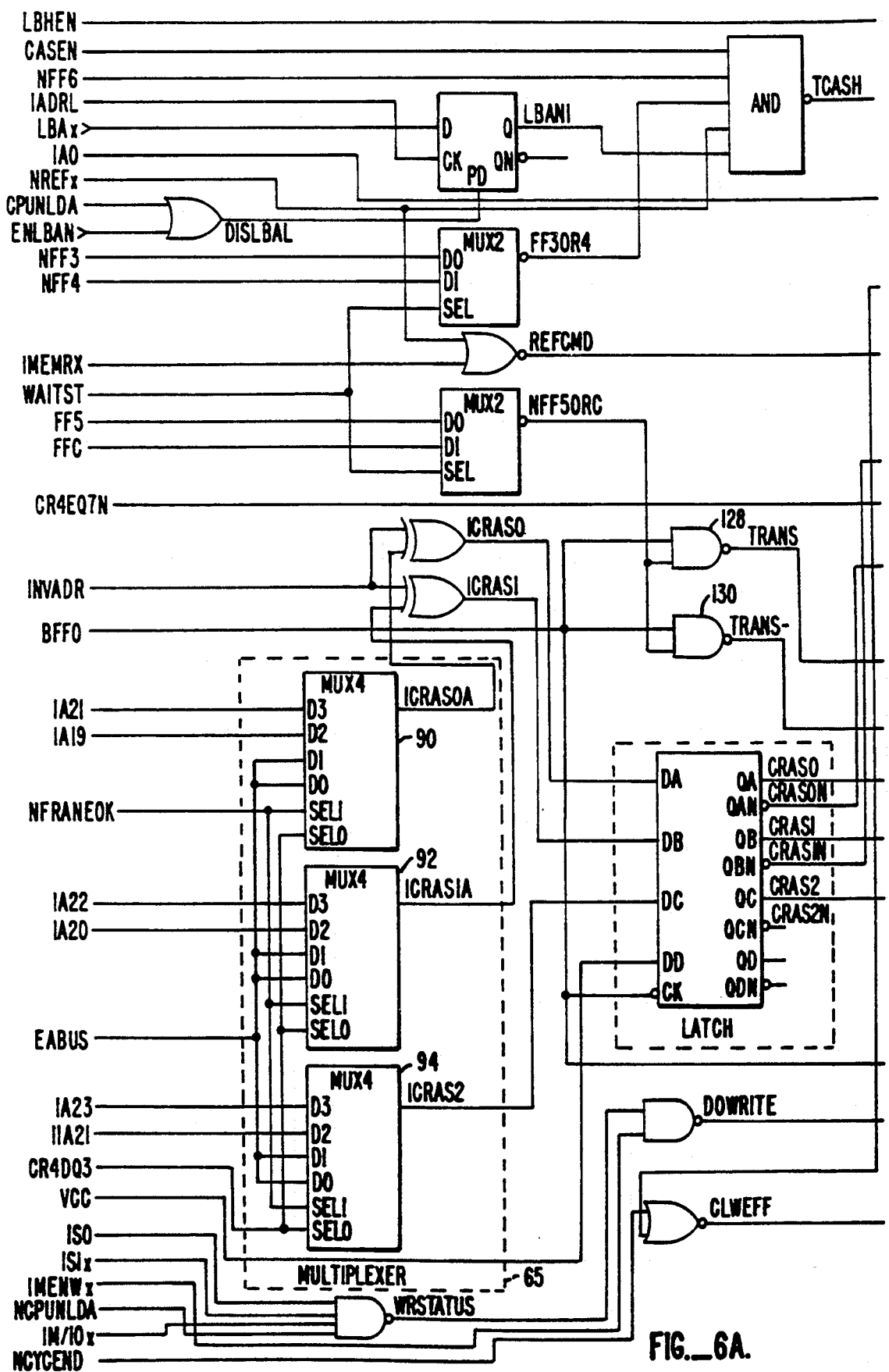
FIG._6A.

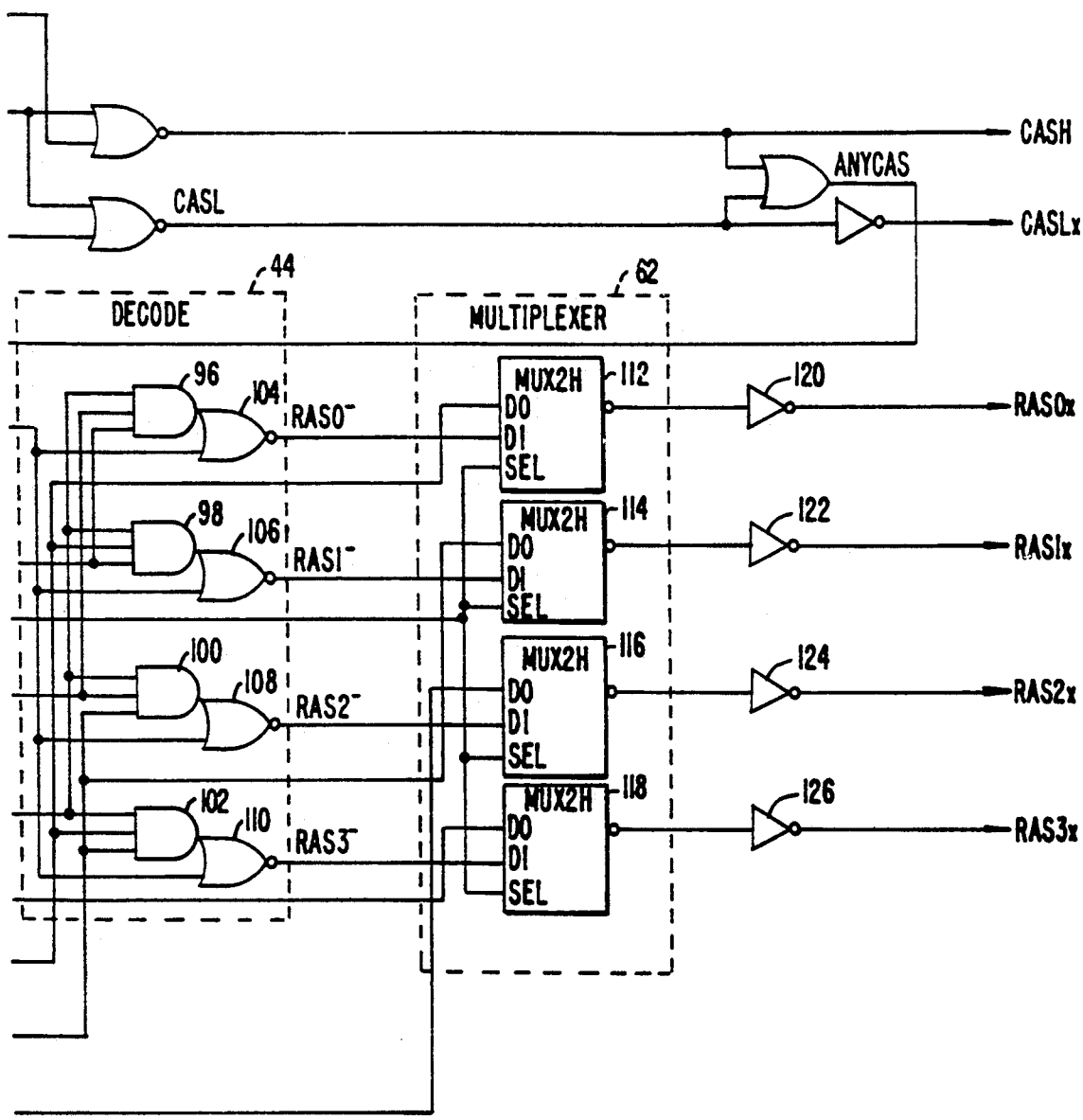
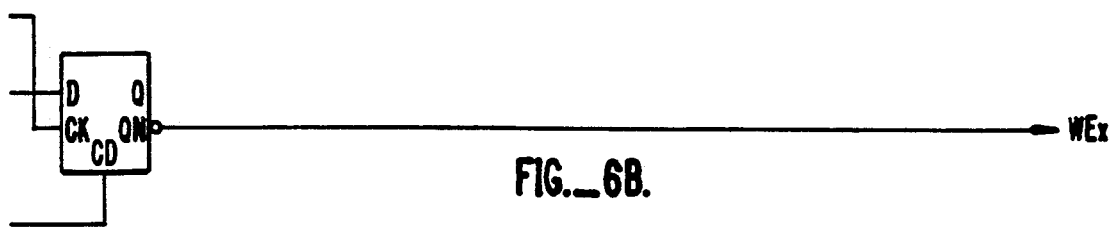
FIG._6B.
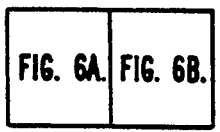
FIG._6.

APPARATUS FOR SELECTIVELY PROVIDING RAS SIGNALS OR RAS TIMING AND CODED RAS ADDRESS SIGNALS

BACKGROUND

The present invention relates to memory controllers which produce row address strobe (RAS) signals from addresses produced by a microprocessor in order to select an appropriate bank of memory.

In a typical personal computer, a number of semiconductor chips are needed to assist the microprocessor in various functions. A memory controller chip is often used to control dynamic random access memory (DRAM). Typically, the microprocessor will simply generate addresses on a group of address lines. The memory controller decodes these addresses and determines which of a number of banks of memory to select. This is typically done by decoding the higher order address bits, while the lower order address bits are provided directly to the memory chips in the bank to select the appropriate location in the particular bank of memory.

Such a memory controller is also used to refresh the DRAM. DRAM memory must periodically have signals applied to each of its memory locations to maintain the charge which indicates stored data. This is called a refresh operation and requires periodically selecting address locations for refresh.

The memory controller chip has a limited number of pins. In addition to the functions described above, it performs many other functions as well. In a typical memory configuration, four output pins might be dedicated as the RAS outputs for selecting one of four banks of memory. If a typical PC maker wants to use 10 banks of memory, for instance, 10 RAS outputs would be required. This obviously would require more pins on the memory controller semiconductor chip, or require eliminating other functions provided by the MMU. In addition, providing several different types of physically different chips depending upon the number of banks of memory a PC maker will want to implement would be very costly.

One possibility would be to do the address decoding necessary to generate the RAS signals outside of the memory controller, by bypassing the memory controller and using the addresses from the microprocessor directly. However, this solution does not allow addresses which are translated by the memory controller to be used. For instance, many memory controllers support extended memory space (EMS). EMS provides a mapping from one address space to another to provide additional memory space which would not be addressable by the number of address bits from the microprocessor itself This is accomplished by setting up an EMS window address, which, when addressed, activates a translation mechanism which provides a substitute, translated address. The memory controller, when EMS is activated, uses the EMS address to generate the RAS signals. A circuit external to the memory controller would not be able to have access to these EMS addresses unless more pins were used to output them from the memory controller chip.

SUMMARY OF THE INVENTION

The present invention provides an improved memory controller which can support varying numbers of banks of memory without requiring any more RAS output pins than are necessary for a minimum number of banks of memory. The memory controller chip has N RAS output pins. An internal decoder selects one of N decode outputs after decoding internally provided coded RAS addresses. A timing signal is generated to control the duration of the selected decoder output to provide the proper pulse length for the RAS signal. An internal multiplexer, with its outputs coupled to the RAS output pins, selects either the N decode outputs from the decoder or the timing signal and the internally provided addresses directly.

For instance, where N=4, the internal multiplexer will be selected to provide 4 RAS outputs in one mode. In another mode, the internal multiplexer will be selected to provide RAS timing on one output and the coded RAS address signals on the other three outputs. An external decoder chip can then use the three coded RAS address signals as inputs and provide up to 8 RAS outputs. The external decoder outputs can be pulsed using the RAS timing signal The coded RAS address signals provided to the external decoder will already have been translated into EMS addresses when the EMS option is selected.

The present invention thus provides the capability to address multiple configurations of memory with a minimum number of pins. For a further understanding of the nature and advantages of the invention, reference should be made to the ensuing description taken in conjunction with the accompanying drawings.

BRIEF DESCRIPTION OF THE DRAWINGS

FIG. 1 is a block diagram of a prior art memory management unit addressing four banks of memory;

FIG. 2 is a diagram of a memory controller and memory according to the present invention which can address either 4 or 8 banks of memory;

FIG. 3 is a block diagram of the circuitry of the memory controller of FIG. 2 for providing either the RAS signals directly, or the RAS timing signal and the coded RAS address, signals;

FIG. 4 is a diagram of one embodiment of the external decoding circuitry show in FIG. 2;

FIGS. 5A and 5B are timing diagrams for the signals of FIG. 4; and

FIG. 6 is a more detailed circuit diagram of the circuit of FIG. 3.

DETAILED DESCRIPTION OF THE PREFERRED EMBODIMENT

FIG. 1 shows a prior art memory controller 10 which controls 4 banks of memory labeled memory 1-memory 4. Memory controller 10 receives address and control signals on a bus 12 from a microprocessor (not shown). It produces output RAS signals on lines 14, 16 18, and 20. These signals, RAS0-RAS3, select one of the 4 banks of memory, memory 1-memory 4, by providing a RAS signal only to the chips on that bank. Memory controller 10 also produces column address strobe (CAS) signals on lines 22 and 24. These signals are provided to all of memory banks 1-4 to select either the odd or even half of a particular bank of memory.

FIG. 2 shows a memory controller 30 according to the present invention which has outputs, shown by dotted lines, 32, 34, 36 and 38, coupled to memory 1-memory 4, similar to FIG. 1. In addition, FIG. 2 shows a decoder circuit 40 which provides 8 outputs to memories 1-4 and memory 5-memory 8. These outputs are provided on lines RAS0-RAS7.

In one mode, memory controller 30 provides signals RAS0-RAS3 on lines 32, 34, 36 and 38 to memory 0-3. This configuration supports 4 banks of memory. Alternately, through the use of decoder 40, 8 banks of memory can be supported. In this case, memory controller 30 uses the same output pins, but instead provides a RAS timing signal on line 32 as a control input to decoder 40. The other outputs of memory controller 30 are provided as inputs to decoder 40, which then selects one of the 8 RAS outputs upon decoding the 3 input values. This allows additional memory banks, memory 4-memory 7, to be addressed. As can be seen, a single memory controller 30 will support both the configuration with 4 banks and the configuration with 8 banks of memory.

FIG. 3 is a block diagram of the internal circuitry of memory controller 30 of FIG. 2. A latch 42 provides the address signals (whether EMS translated or not) to a decode circuit 44. Decode circuit 44 receives outputs on lines 46, 48 and 49 from latch 42, which are the coded RAS address signals. In addition, decode circuit 44 receives a timing signal on a line 50 from a timing circuit 52. The outputs of the decode circuit 44 on lines 54, 56, 58 and 60 are the normal RAS0-RAS3 signals shown in FIG. 1 of the prior art. Thus, for the 4 bank configuration, a multiplexer 62 selects lines 54-60 and provides them to outputs 32, 34, 36 and 38. The select input of multiplexer 62 is provided by a configuration register 64 which has a bit set depending on whether the system is going to support 4 or 8 banks of memory.

For a system configured to support 8 banks of memory, register 64 will select the other inputs of multiplexer 62, which are coded RAS address signals on lines 46, 48 and 49 along with the timing signal on line 50.

Timing circuit 52 is, for the purposes of this invention, the same as the timing circuit of the prior art memory management unit 10 of FIG. 1. Such a memory management unit could be, for instance, the one contained in part No. 82C212 available from Chips and Technologies of San Jose, Calif.

FIG. 3 also shows a second multiplexer 65 which selects one of 4 groups of inputs. The first two sets of inputs are address pins EA19-EA21, indicating extended memory space address bits 19-21. Alternately, the second set of inputs will provide address bits A19-A21 without the EMS translation. A select input S1 is provided from EMS translation logic 67 on a line 68 to select either the EMS addresses, when EMS is enabled, or the regular untranslated addresses The selected address bits are provided on lines 70, 72 and 74 to latch 42. These address bits are used when the banks of memory are configured with 256K memory chips. The embodiment shown also supports banks of memory using one megabit memory chips. The one megabit addresses use more significant bits of the address, such as EA21-23 (for EMS) or A21-A23 (for non-EMS mode), shown as the last two sets of inputs to MUX 65. These one megabit inputs or the 256K inputs above are selected by an input select S2 on a line 76 from configuration register 66.

FIG. 4 shows one embodiment of the external decoder 40 of FIG. 2 for use with the present invention. A decoder 78 shown, which can be a commercially available 74F538 decoder. This decoder has 8 inverted outputs, which are shown as lines RAS0-RAS7. One of these 8 outputs is selected by decoding one of 3 inputs A, B or C, which are connected to receive signals CRAS0-CRAS2, as shown. These are the signals on lines 34, 36 and 38 of FIGS. 2 and 3. The timing signal would be provided on input line 32 to an inverted chip enable CE2 of decoder 78. The other inverted chip enable signal, CE3, is grounded. A noninverted chip enable signal, CE1, is coupled to receive the $\overline{\text{MREF}}$ signal. $\overline{\text{MREF}}$ is also provided as an input to OR gate 80, along with the $\overline{\text{XMEMR}}$ signal. The output of OR gate 80 is coupled to an invert input 82 of the decoder 78.

The $\overline{\text{MREF}}$ signal indicates that a memory refresh operation is desired. The $\overline{\text{XMEMR}}$ signal is used for a normal memory read operation. The decoder, as can be seen, will thus be enabled to provide an output on one of RAS0-RAS7 when there is no $\overline{\text{MREF}}$ signal (active low) and when there is a RAS timing signal (active low).

For a refresh operation, $\overline{\text{MREF}}$ disables the decoding aspects of the chip, but the invert input on line 82 will cause the no output state of RAS0-RAS7 to be low instead of high. Thus, all of RAS0-RAS7 will be active to allow all banks of memory to be refreshed. The invert input of line 82 from OR gate 80 is provided when there is both a memory read signal $\overline{\text{XMEMR}}$ (active low) and a memory refresh signal $\overline{\text{MREF}}$.

FIG. 5A shows the timing of the $\overline{\text{MREF}}$, $\overline{\text{XMEMR}}$ and address signals for a refresh cycle. An /MREF signal 84 will go low, indicating the memory refresh operation. The memory refresh is done by providing the proper address signals 86 and then doing a memory read operation by activating memory read signal 88, $\overline{\text{XMEMR}}$.

FIG. 5B shows the timing for a normal read or write operation. $\overline{\text{MREF}}$ is at an inactive high state, and there is no $\overline{\text{XMEMR}}$.

FIG. 6 shows the circuit of FIG. 3 in more detail. As can be seen, multiplexer 65 is built from three smaller multiplexing circuits 90, 92 and 94. Decode circuit 44 is constructed with AND gates 96, 98, 100 and 102 along with NOR gates 104, 106, 108 and 110. Multiplexer 62 is built with 4 smaller multiplexing circuits 112, 114, 116 and 118. Buffers 120, 122, 124 and 126 are provided at the outputs of multiplexer 62.

The RAS timing signals are provided through AND gates 128 and 130 from other circuitry shown in FIG. 6 and circuitry not shown. These timing signals are generated by circuitries similar to that shown in Chips and Technologies' part No. 82C212.

As will be understood by those familiar with the art, the present invention may be embodied in other specific forms without departing from the spirit or essential characteristics thereof. For example, 5 RAS outputs could be provided, which could support either 5 banks of memory or up to 16 banks of memory in alternate configurations. Accordingly, the disclosure of the preferred embodiment of the invention is intended to be illustrative, but not limiting, of the scope of the invention which is set forth in the following claims.

What is claimed is:

1. A memory control unit comprising:
   N row address strobe (RAS) outputs;
   means for selectively providing an address externally provided to said memory control unit or a translated expanded memory space (EMS) address, said means for selectively providing addresses including a multiplexer;

said multiplexer including two additional inputs of different address bits of said EMS address and external address for a different size of memory bank;

means for decoding said addresses to select, for predetermined addresses, one of N decode outputs;

means for providing a timing signal to control the duration of a signal on said selected decode output; and multiplexing means, coupled to said means for providing addresses, said means for decoding and said means for providing a timing signal, for selectively coupling to said RAS outputs said addresses and said timing signal or said decode outputs.

2. The memory control unit of claim 1 further comprising EMS logic having an output coupled to a first select input of said multiplexer for selecting either said EMS or said external addresses, and a configuration register having an output of said configuration register coupled to a second select input of said second multiplexer for selecting different address bit inputs for either first or second memory bank sizes.

3. A memory control unit comprising:

N row address strobe (RAS) outputs;

means for providing addresses;

means for decoding said addresses to select, for predetermined addresses, one of N decode outputs;

means for providing a timing signal to control the duration of a signal on said selected decode output;

multiplexing means, coupled to said means for providing addresses, said means for decoding and said means for providing a timing signal, for selectively coupling to said RAS outputs said addresses and said timing signal or said decode output;

a decoder, external to said memory control unit, for decoding said N RAS outputs and providing a number greater than N outputs, with one of said greater than N outputs being selected by a code provided on said N RAS outputs, with the selected output having a timing as determined by said timing signal, wherein said external decoder includes a first chip enable signal coupled to receive said timing signal and a second chip enable signal coupled; to receive a memory refresh signal.

4. The memory control unit of claim 3 wherein said decode circuit includes an inverting input, and further comprising an OR gate having an output coupled to said inverting input and having inputs coupled to receive said memory refresh signal and a memory read signal.

5. A memory control unit comprising:

N row address strobe (RAS) outputs;

first multiplexing means for selectively providing an internal address from an external address externally provided to said memory control unit or a translated expanded memory space (EMS) address;

means for decoding said addresses to select, for predetermined addresses, one of N decode outputs;

means for providing a timing signal to control the duration of a signal on said selected decode output;

a latch coupled between said first multiplexing means and said means for decoding;

second multiplexing means, coupled to said latch means, said means for decoding and said means for providing a timing signal, for selectively coupling to said RAS outputs said addresses and said timing signal or said decode outputs, said second multiplexing means including two additional inputs of different address bits of said EMS address and external address for a different size of memory bank;

a first configuration register output coupled to said first multiplexing means as a select input;

an EMS logic circuit having an output coupled to a first select input of said second multiplexing means for selecting either said EMS or said external addresses; and a second configuration register output coupled to a second select input of said second multiplexing means for selecting different address bit inputs for either first or second memory bank sizes.

6. A memory control system comprising:

a memory control unit including

N row address strobe (RAS) outputs, means for providing addresses, means for decoding said addresses to select, for predetermined addresses, one of N decode outputs, means for providing a timing signal to control the duration of a signal on said selected decode output, multiplexing means, coupled to said means for providing addresses, said means for decoding and said means for providing a timing signal, for selectively coupling to said RAS outputs said addresses and said timing signal or said decode outputs; and a decoder, external to said memory control unit, for decoding said N RAS outputs and providing a number greater than N outputs, with one of said greater than N outputs being selected by a code provided on said N RAS outputs, with the selected output having a timing as determined by said timing signal, wherein said external decoder includes a first chip enable signal line coupled to receive said timing signal and a second chip enable signal line coupled to receive a memory refresh signal.

7. The memory control unit of claim 6 wherein said decode circuit includes an inverting input, and further comprising an OR gate having an output coupled to said inverting input and having inputs coupled to receive said memory refresh signal and a memory read signal.

* * * * *